(12) United States Patent  
Desai et al.

(10) Patent No.: US 9,324,397 B1  
(45) Date of Patent: Apr. 26, 2016

(54) COMMON DIE FOR SUPPORTING DIFFERENT EXTERNAL MEMORY TYPES WITH MINIMAL PACKAGING COMPLEXITY

(71) Applicant: QUALCOMM Incorporated, San Diego, CA (US)

(72) Inventors: Kunal Mukesh Desai, Bangalore KRN (IN); Piyush Gupta, San Diego, CA (US); Bernie Jord Yang, San Diego, CA (US); Umesh Madhusudan Rao, Bangalore KRN (IN)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/598,528

(22) Filed: Jan. 16, 2015

(51) Int. Cl.
*G11C 7/00* (2006.01)
*G11C 7/22* (2006.01)
*G11C 7/10* (2006.01)
*G11C 8/06* (2006.01)
*G11C 8/18* (2006.01)

(52) U.S. Cl.
CPC .. *G11C 7/22* (2013.01); *G11C 7/10* (2013.01); *G11C 8/06* (2013.01); *G11C 8/18* (2013.01)

(58) Field of Classification Search
CPC ...... G11C 11/4076; G11C 7/22; G11C 7/222; G11C 2207/2254; G11C 7/1072; G11C 7/1051; G11C 7/1066; G11C 7/1078; G11C 7/1093; G11C 7/04; G11C 11/4096; G11C 7/225; G11C 7/10; G11C 7/109

USPC ........ 365/191, 233.11, 189.011, 189.05, 194, 365/233.13, 189.14, 189.16, 189.17, 365/189.02, 189.03, 189.04, 189.07, 365/189.15, 189.18
See application file for complete search history.

(56) References Cited

U.S. PATENT DOCUMENTS

| | | | |
|---|---|---|---|
| 8,446,903 B1 | 5/2013 | Ranganathan et al. | |
| 2010/0077267 A1* | 3/2010 | Perego ................ | G11C 7/1075 714/716 |
| 2012/0185663 A1 | 7/2012 | Yokoya et al. | |
| 2014/0006670 A1 | 1/2014 | Wagh | |
| 2014/0040541 A1 | 2/2014 | Yoo et al. | |

FOREIGN PATENT DOCUMENTS

WO   WO-2014133527 A1   9/2014

* cited by examiner

*Primary Examiner* — Thong Q Le
(74) *Attorney, Agent, or Firm* — Haynes and Boone, LLP

(57) ABSTRACT

A configurable die including a logic element configured to communicate a control and address (CA) signal and a data (DQ) signal, and a first generic physical interface (PHY) and a second generic PHY in communication with the logic element, wherein each of the first generic PHY and the second generic PHY is configurable as a CA PHY and as a DQ PHY, and wherein the logic element is configurable to communicate the CA signal and the DQ signal to different ones of the first and second generic PHYs.

29 Claims, 12 Drawing Sheets

COMMON DIE FOR SUPPORTING DIFFERENT EXTERNAL MEMORY TYPES WITH MINIMAL PACKAGING COMPLEXITY

TECHNICAL FIELD

This application relates to chip connections to memory devices, and more particularly, to chip connections on a common die to accommodate connecting the die to different external memory types with simple packaging and at low cost.

BACKGROUND

Synchronous dynamic random-access memory (SDRAM) is one class of memory used in mobile communication and computing devices, such as smart phones and tablet computers. In some embodiments, double data rate SDRAM (DDR SDRAM or DDR) refers to a type of memory and an associated interface for communicating with the memory. Furthermore, low power DDR (LPDDR or simply LP), sometimes referred to as mobile DDR, is a class of DDR designed to reduce power consumption, with mobile devices being a target application. There are several versions of LPDDR corresponding to various data speeds and power requirements. For example, LPDDR3 (also sometimes denoted as LP3) and LPDDR4 (also sometimes denoted as LP4) are two recent versions of LPDDR. LPDDR4 is designed to communicate at a higher speed and consume less power than LPDDR3 at the expense of increased cost and/or complexity.

A trend in modern mobile devices, such as smartphones, is to focus memory designs on ever greater memory transfer rate while at the same time conserving power. A system on chip (SoC) is often used in mobile devices to conserve power and/or minimize space requirements. A SoC refers to multiple functional blocks, such as modems and application processor cores, embedded on a single substrate, allowing mobile devices to execute complex and power intensive applications. The single substrate is sometimes referred to as a die, so multiple functional blocks are commonly implemented on a single die.

In some instances, a package-on-package (PoP) can refer to a packaging configuration in which two or more packages are stacked on top of each other with an interface to pass signals between them. The Joint Device Engineering Council (JEDEC) has standardized one or more PoP footprints for interfacing with an LPDDR3 SDRAM memory. There is at least one proposal in JEDEC for a PoP footprint for interfacing with an LPDDR4 SDRAM memory. Differences in LPDDR3 and LPDDR4 result in the corresponding footprints being significantly different.

Mobile device applications are demanding more and faster memory, so the tendency is to focus SoC, and corresponding die, designs on optimizing routing and packaging for faster memory, such as LPDDR4. However, it may be desirable in price-sensitive markets, such as markets that focus on low or mid-tier smartphones, to offer the flexibility to vendors to tradeoff price and performance to offer mobile devices at different price points. One of the options may be to offer LPDDR3, as opposed to LPDDR4, as a lower-cost memory alternative. However, once an SoC die is optimized for LPDDR4 packaging, it may be overly costly to retrofit routing and packaging for LPDDR3. Thus, there is a need for SoC dies that flexibly accommodate different memory architectures.

SUMMARY

Dies for supporting different memory types with minimal packaging complexity are disclosed. In one embodiment, a die common to different memory types is configurable to support each of two memory types in a PoP configuration with simple interconnections between packages, regardless of which of the two memory types is used. For example, one supported memory type is LPDDR3 and a second supported memory type is LPDDR4.

In one embodiment, a configurable die is disclosed that includes a logic element configured to communicate a control and address (CA) signal and a data (DQ) signal, and a first generic physical interface (PHY) and a second generic PHY in communication with the logic element. Each of the first generic PHY and the second generic PHY is configurable as a CA PHY and as a DQ PHY, and the logic element is configurable to communicate the CA signal and the DQ signal to different ones of the first and second generic PHYs.

In another embodiment, an apparatus is disclosed that includes an SoC for selectively supporting a first type of memory and a second type of memory, including a generic PHY configurable as a CA PHY and as a DQ PHY in response to an input corresponding to which of the first type of memory or the second type of memory is being supported. The apparatus also includes a means for communicating CA signals and DQ signals to the generic PHY in response to the input.

In yet another embodiment, a PoP apparatus is disclosed that includes a first package comprising memory circuitry configured to selectively support one of a first type of memory and a second type of memory. The memory circuitry includes a plurality of PHYs, each of the plurality of interfaces being configurable as a CA PHY and as a DQ PHY. The memory circuitry also includes a logic element configured to communicate CA signals to PHYs in the plurality of PHYs configured as CA PHYs, and communicate DQ signals to and from PHYs in the plurality of PHYs configured as DQ PHYs. The PoP apparatus also includes a second package including the first type of memory or the second type of memory. The second package is coupled to the first package in a PoP configuration.

In yet another embodiment, a method is disclosed for supporting different memory types using a single die. The method includes receiving a memory type indication and communicating a CA signal to a first generic PHY based on the memory type indication. The method also includes communicating a DQ signal to a second generic PHY based on the memory type indication.

8B illustrates connections between the common die configured for LPDDR4 PoP and an LPDDR4 footprint in accordance with an embodiment of the disclosure.

Figure 9:
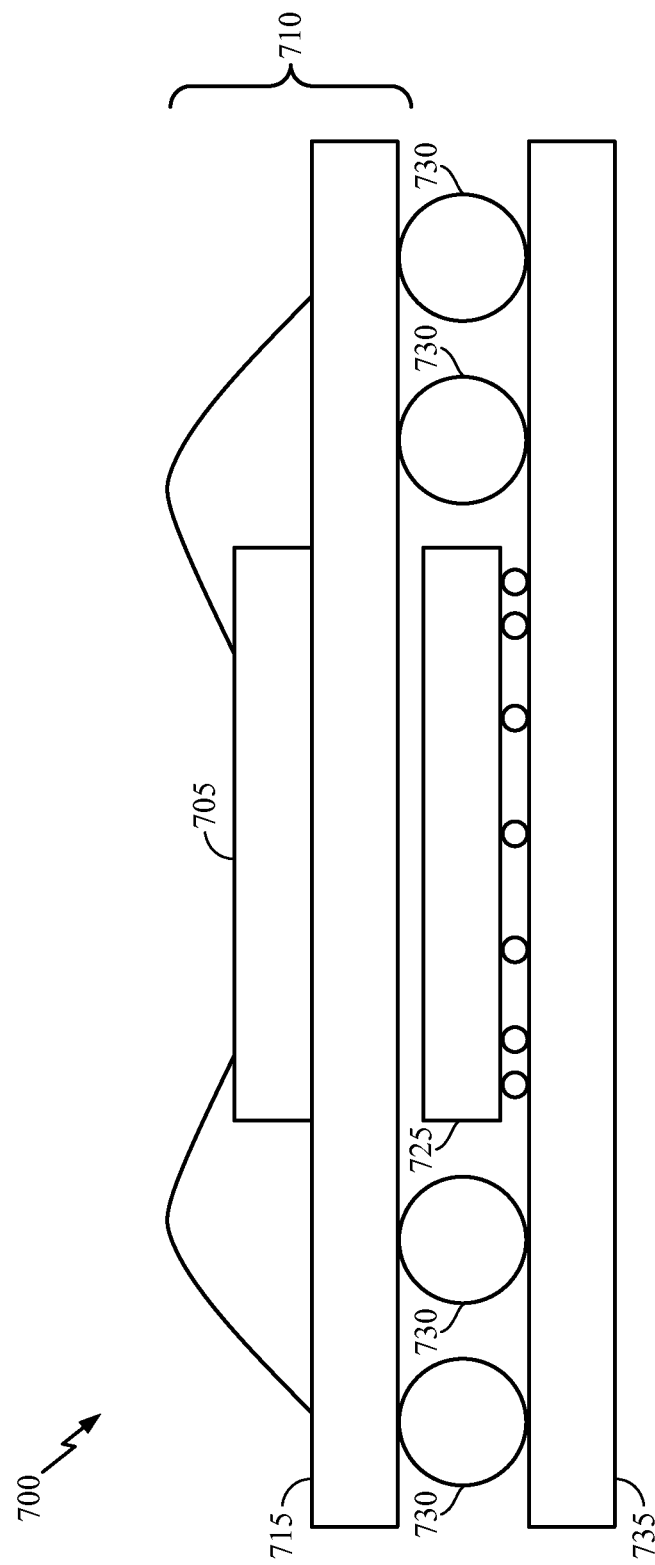

FIG. 9 is a perspective view of a PoP with a common die in accordance with an embodiment of the disclosure.

Figure 10:
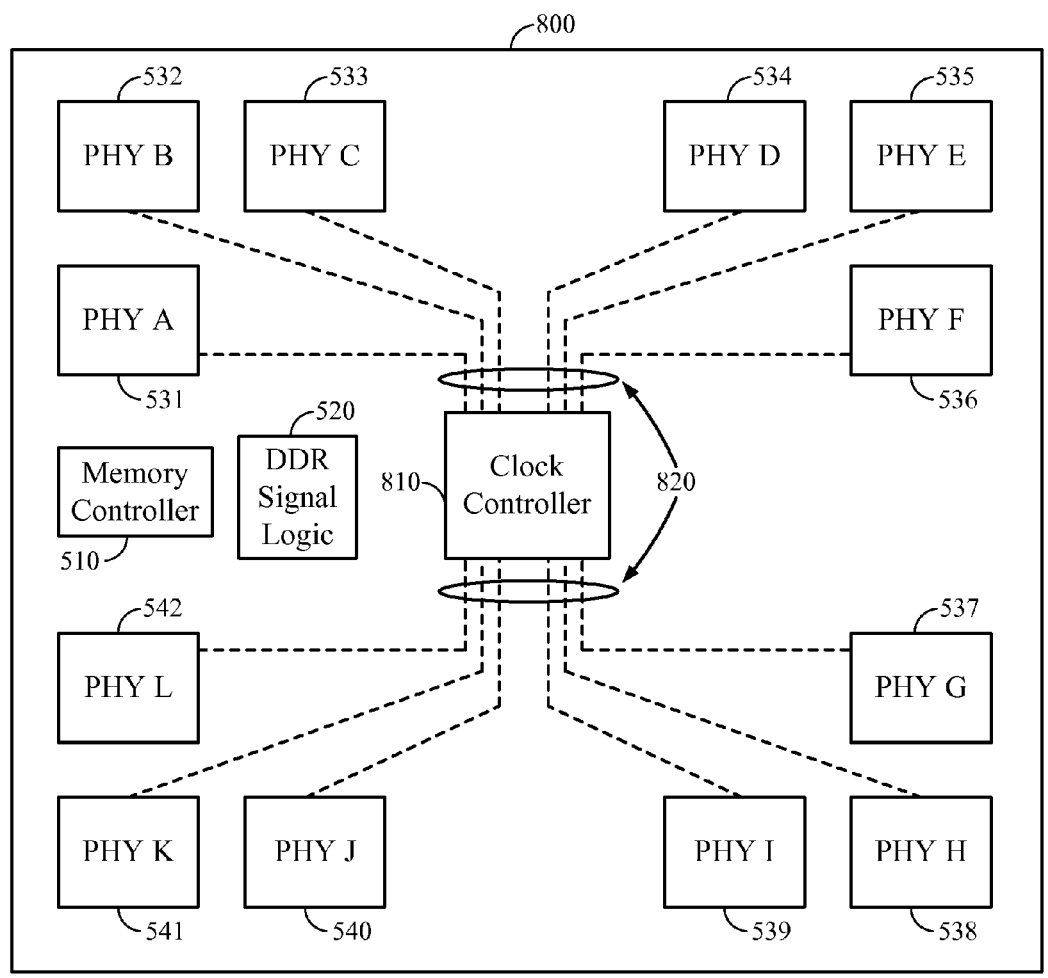

FIG. 10 illustrates a die common to both LPDDR3 and LPDDR4 that includes a single clock controller in accordance with an embodiment of the disclosure.

Figure 11:
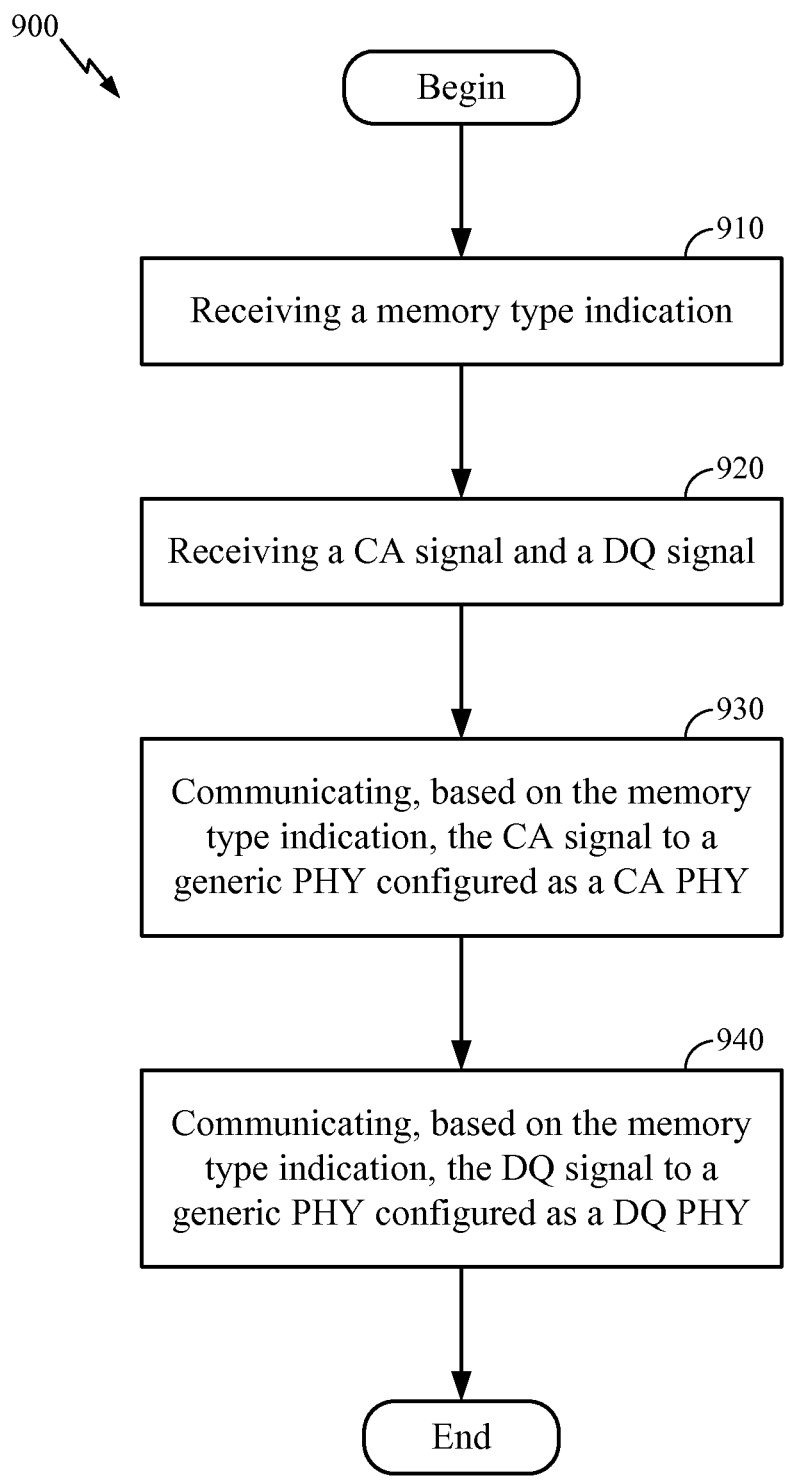

FIG. 11 illustrates a flowchart of an example method of using a common die in accordance with an embodiment of the disclosure.

DETAILED DESCRIPTION

Disclosed herein are embodiments of a configurable die that supports multiple types of memory using a relatively simple and low-cost PoP configuration. In one application, the configurable die provides smartphone vendors and manufacturers the choice of using either a cheaper memory type for low to mid-tier smartphones or a more expensive memory type, which is faster and/or has a larger capacity than the cheaper memory, for high-tier smartphones. The same die can be used for both memory types without introducing additional layers for package routing, or other more expensive techniques such as an interposer, regardless of the type of memory. Furthermore, no changes are required in the memory die or memory package. The types of memory supported by a configurable die include LPDDR3 memory and LPDDR4 memory, as examples.

A configurable die may employ a number of features that makes such flexibility possible. Exemplary embodiments may include one or more of the following features. First, generic PHYs may be employed that are configurable as a CA PHY or a DQ PHY and can be configured according to the PoP memory footprint supported by the die. Second, a flexible signal logic element may be employed for routing CA and DQ signals to and from appropriate PHYs according to the PoP memory footprint supported by the die. Third, a clock controller may be employed that provides matching clock signals to all PHYs on the die to provide flexibility for any PHY to handle different types of signals according to the PoP memory footprint supported by the die. A memory controller is able to produce CA encodings with appropriate timing relationships for the different types of memory supported.

Figure 1:
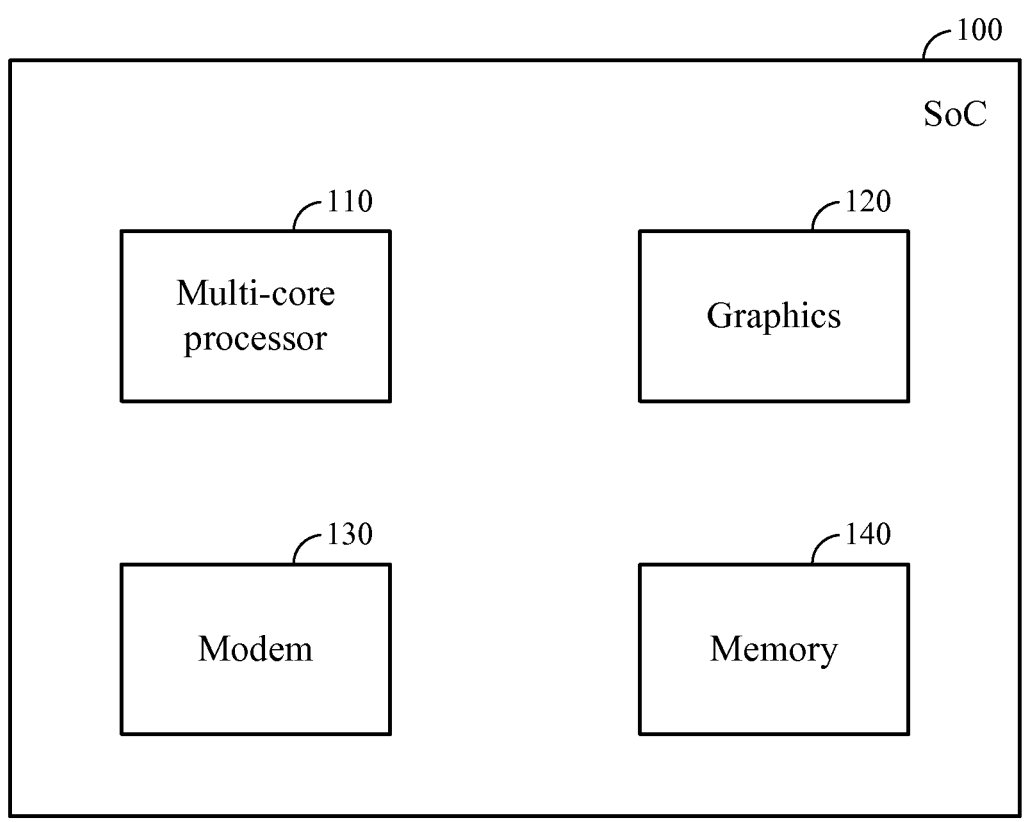
FIG. 1 is an architectural diagram illustrating an example SoC die and corresponding architecture in accordance with an embodiment of the disclosure.

FIG. 1 is an architectural diagram illustrating an example system-on-chip (SoC) 100 die and corresponding architecture. In an embodiment, the SoC die 100 is used in a smartphone, a tablet computer, or other mobile wireless device. The SoC die 100 includes a number of functional blocks, including a multi-core processor 110 (sometimes referred to as a central processing unit or CPU), a graphics processor 120, a modem 130, and a memory circuitry 140 as shown in FIG. 1. FIG. 1 is a logical layout of an SoC die 100 that shows each of the areas 110-140 for the noted functions as separate and distinct areas, but the actual physical layout may be more complex with, for example, circuitry of one functional block interspersed among circuitry for another functional block. In an embodiment, the modem implements baseband processing for any of a number of known wireless technologies or standards, such as long term evolution (LTE). The processors 110-130 refer to areas of the SoC die 100 devoted to those functional blocks. In each of these areas, there is circuitry for the designated function. The memory circuitry 140 may refer to an area of the SoC die 100 devoted to memory controller and interface circuits for interfacing to an external memory. The external memory may, for example, be housed in a package with interfaces for connecting to the memory circuitry 140. The memory circuitry 140 can be configured to interface with any type of memory, such as a DDR SDRAM, DRAM, or flash memory. For the purposes of illustration this disclosure focuses on DDR SDRAM, such as LPDDR3 and LPDDR4. At least one of multi-core processor 110, graphics processor 120, and modem 130 is in communication with memory circuitry 140. The various components may communicate via any form of known connection, such as a bus.

Figure 2:
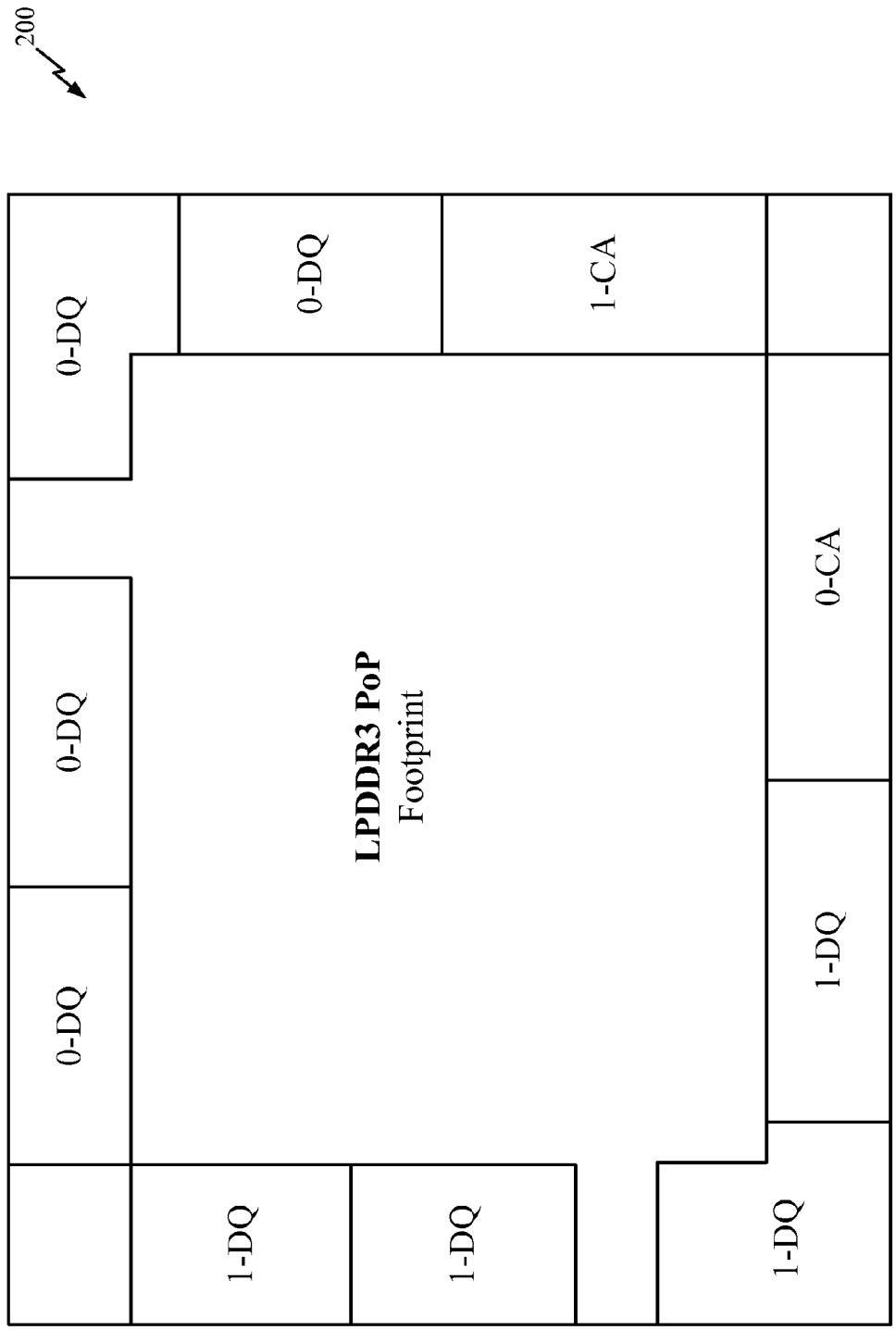
FIG. 2 illustrates an LPDDR3 PoP footprint in accordance with an embodiment of the disclosure.
Figure 3:
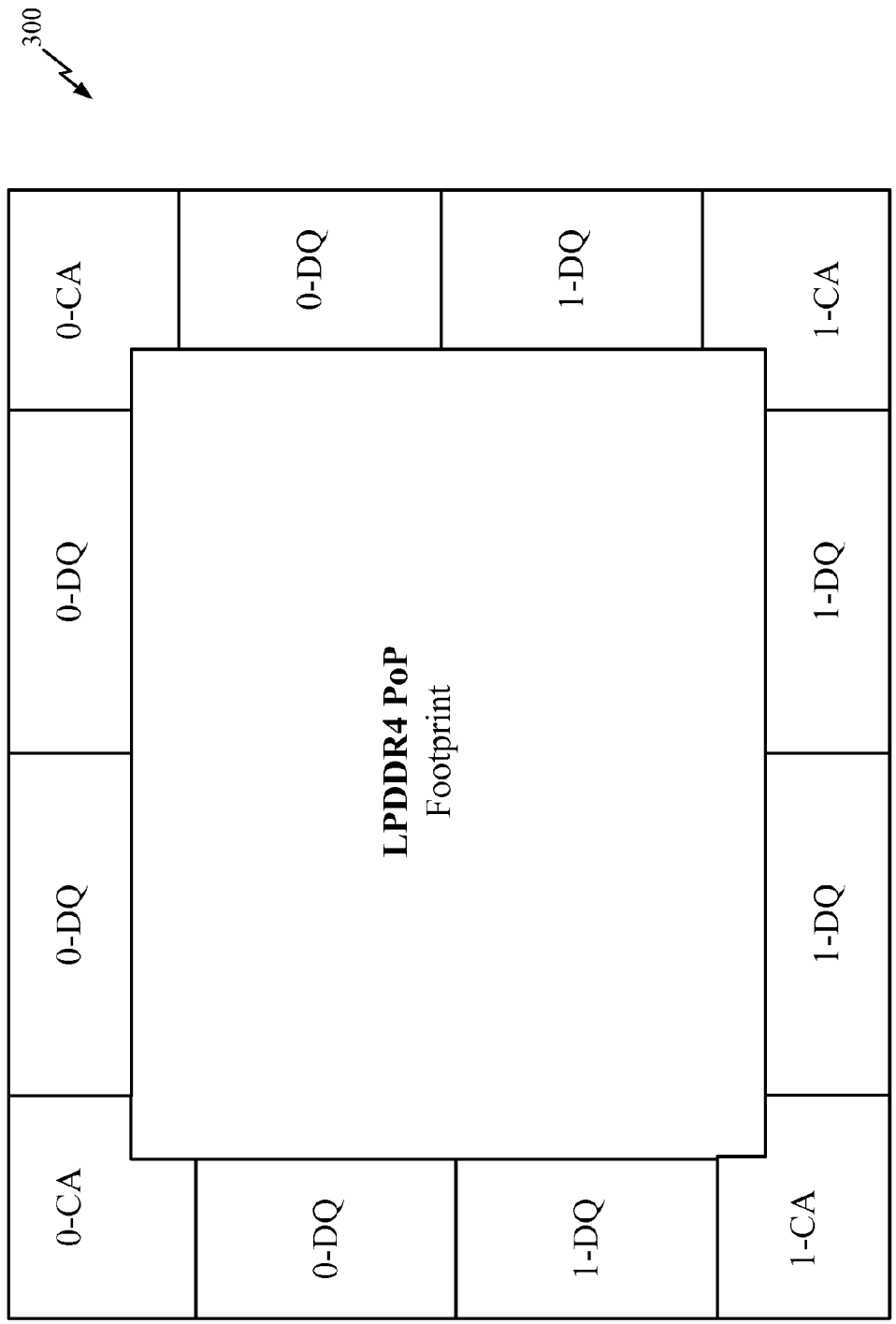
FIG. 3 illustrates an LPDDR4 PoP footprint in accordance with an embodiment of the disclosure.

In some embodiments, a "PoP footprint" (or "footprint" for short) refers to the locations of electrical connections on a DDR SDRAM memory package. In an embodiment, a PoP footprint specifies the locations on a DDR SDRAM memory package that connect to a corresponding SoC package, which includes an SoC die 100. The memory circuitry 140 can be designed to accommodate various DDR footprints, such as the footprint for LPDDR3 or LPDDR4. Differences in LPDDR3 and LPDDR4 result in the corresponding footprints being physically different. FIG. 2 illustrates an example LPDDR3 PoP footprint 200, and FIG. 3 illustrates an example LPDDR4 PoP footprint 300. The notation x-DQ indicates channel x (0 or 1) for data, and y-CA indicates channel y (0 or 1) for command and address information. The blocks labeled "CA" and "DQ" are fixed DDR physical layer circuits (PHYs) corresponding to CA and DQ signals. CA and DQ signals for various forms of DDR memory are well known to a person of ordinary skill in the art.

Each of the footprints in FIGS. 2 and 3 illustrates an example 64-bit memory interface. Each of the footprints in FIGS. 2 and 3 correspond to various JEDEC proposals or standards. Referring to FIG. 2, in an embodiment each DQ PHY in the LPDDR3 PoP footprint 200 refers to a particular byte (or eight bits). There are eight DQ bytes resulting in a 64-bit memory interface (natively two channels of 32-bits for LPDDR3). Similarly for LPDDR4, in an embodiment each DQ PHY in the LPDDR4 PoP footprint 300 refers to a particular byte, resulting in a 64-bit memory interface (natively four channels of 16 bits each for LPDDR4). Each CA interface per channel for LPDDR3 corresponds to 10 bits, while a CA interface per channel for LPDDR4 is 6 bits. In one embodiment, a generic CA PHY supports 6 bits. Generally, in the case of LPDDR4, one CA interface is needed for every 16 bits of DQ, whereas in LPDDR3 one CA interface can handle 32 bits of DQ. Thus, for both LPDDR3 and LPDDR4, two CA PHYs are used per 32-bit channel. In an embodiment, the LPDDR4 PoP footprint is natively 4×16 but on die the footprint is implemented as 2×32 (considering two ×16 as a single ×32).

Figure 4:
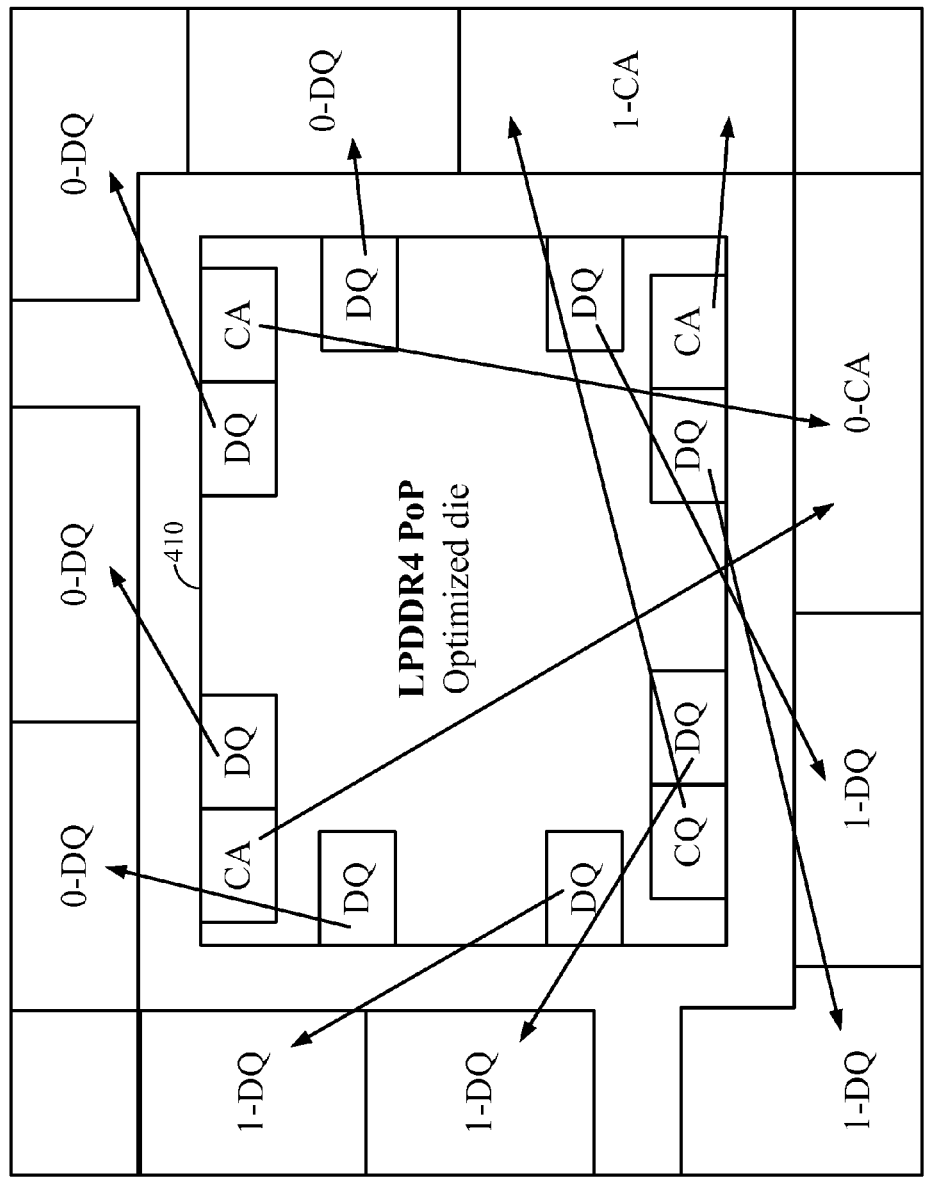
FIG. 4 illustrates routing between an LPDDR4 optimized die and an LPDDR3 PoP footprint in accordance with an embodiment of the disclosure.

As discussed previously, it is desirable in some low-to-mid tier smartphone applications to provide a vendor flexibility to select between LPDDR3 and LPDDR4 depending, as examples, on the desired price point and feature set. If a die is optimized for LPDDR4 PoP and is supposed to also work with LPDDR3 PoP, one consequence is that potentially long criss-cross routes would be required, as illustrated in FIG. 4. FIG. 4 illustrates interconnections between a LPDDR4 PoP optimized die 410 and an LPDDR3 PoP footprint to illustrate the challenges to signal routing. An interposer or other additional layers, such as layers added to a base package, may be used to manage the routing, which may add undesired cost and signal integrity risk. In some embodiments, a PHY refers to an area of a die that includes circuitry, including clock recovery and an input/output (I/O) pad, which provides an interface between a die and a DDR SDRAM memory. In an embodiment, the LPDDR4 die 410 corresponds to an SoC die 100, and in particular indicates a layout of a portion of the memory circuitry 140.

Figure 5:
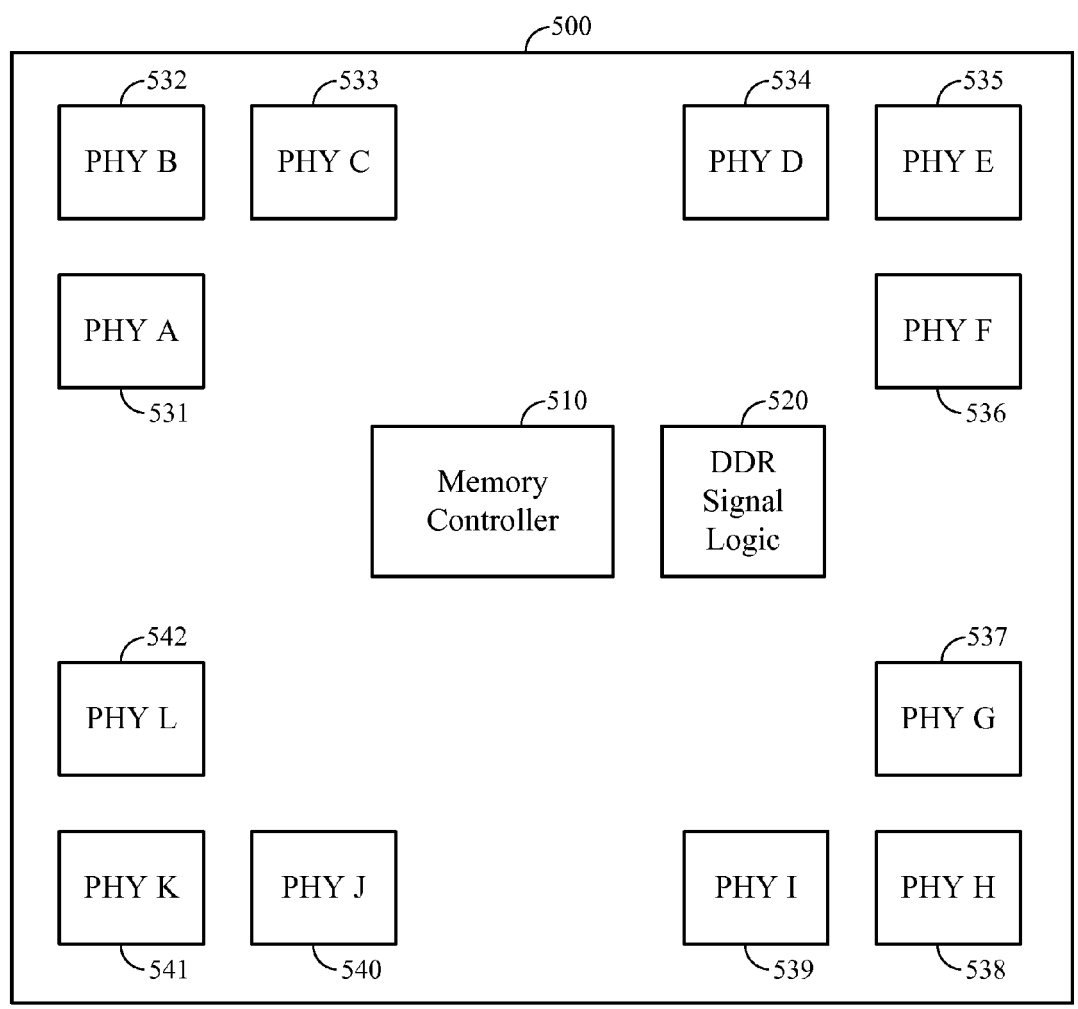
FIG. 5 illustrates a die common to both LPDDR3 and LPDDR4 in accordance with an embodiment of the disclosure.

FIG. 5 illustrates an embodiment of a die 500 common to both LPDDR3 and LPDDR4. The common die 500 overcomes many of the issues discussed above. The common die 500 includes a memory controller 510, a DDR signal logic 520, and DDR PHYs A 531 through L 542 as shown in FIG. 5. In some embodiments, the memory controller 510 is a bus integrated memory controller (BIMC). One or more of the PHYs A 531 through L 542 is a generic or common PHY that can be configured as either a CA PHY or a DQ PHY depending on whether LPDDR3 or LPDDR4 is used. A DQ PHY is bidirectional in the sense that the DQ PHY provides for data to be both written to and read from memory. On the other hand, CA PHYs are typically unidirectional in order to send control and address information to memory, but normally nothing is received from memory via CA PHYs. One tradeoff in using the common die 500 is that any PHY that is a generic PHY that can be configured as a DQ PHY or CA PHY may be slightly larger in area than a PHY designed specifically as a DQ PHY or a CA PHY. Besides the benefit of providing flexibility in being able to choose LPDDR3 or LPDDR4, the slightly larger area for generic PHYs provides a benefit that routing cost and complexity is reduced for a die common to both LPDDR3 and LPDDR4.

Figure 6:
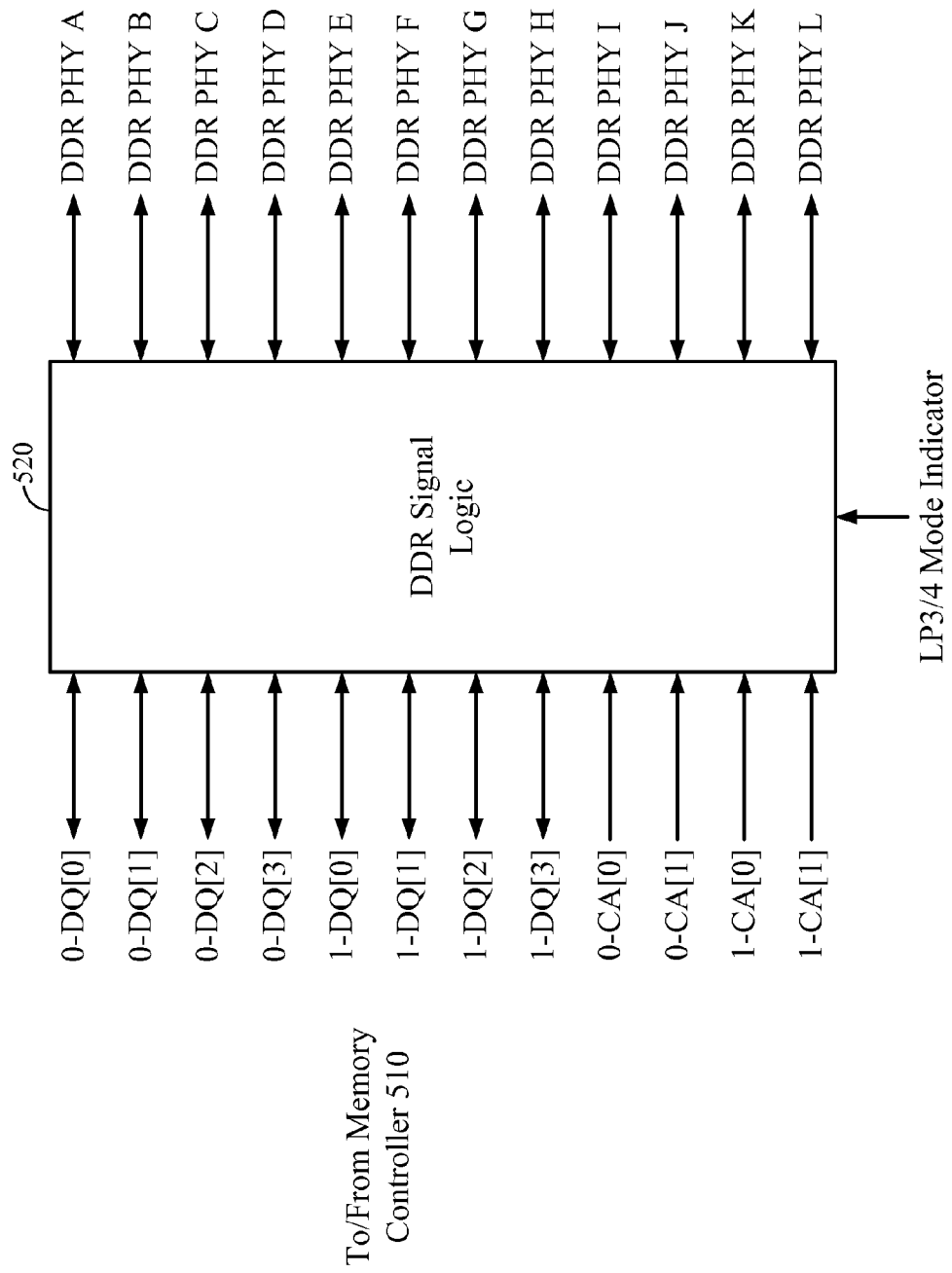
FIG. 6 illustrates DDR signal logic in accordance with an embodiment of the disclosure.

FIG. 6 illustrates an embodiment of the DDR signal logic 520. The DDR signal logic 520 inputs and outputs are illustrated. One function of the DDR signal logic 520 is to route signals between a memory controller 510 and DDR SDRAM. The DDR signal logic 520 receives a control signal that conveys one of two values, each of which correspond to a memory type, such as LPDDR3 or LPDDR4. In an embodiment, the control signal is received from the memory controller 510 or another processing unit. A value of the control signal may be determined from one or more control and status registers (CSRs). At least one CSR may be programmed with a value corresponding to LPDDR3 or LPDDR4 to set the DDR signal logic 520 appropriately.

Table 1 is a channel/PHY mapping table for LP PHYs for an example alignment of LPDDR4 and LPDDR3 memories with respect to the die 500 according to one embodiment. In some embodiments, the DDR signal logic 520 is a logic circuit or element that implements Table 1. The notation x–DQ[n] indicates channel x (0 or 1) and byte number n (0, 1, 2, or 3) for a DQ signal, and the notation y–CA[z] indicates channel y (0 or 1) and bit group number z (0 or 1) for a CA signal. As discussed previously, each CA signal represents five bits for LPDDR3 and six bits for LPDDR4.

TABLE 1

| DDR PHY | LPDDR4 Configuration | LPDDR3 Configuration |
| --- | --- | --- |
| A 531 | 0-DQ[0] | 1-DQ[0] |
| B 532 | 0-CA[0] | 1-DQ[2] |
| C 533 | 0-DQ[1] | 0-DQ[3] |
| D 534 | 0-DQ[2] | 0-DQ[1] |
| E 535 | 0-CA[1] | 0-DQ[0] |
| F 536 | 0-DQ[3] | 0-DQ[2] |
| G 537 | 1-DQ[3] | 1-CA[0] |
| H 538 | 1-CA[1] | 1-CA[1] |
| I 539 | 1-DQ[2] | 0-CA[0] |
| J 540 | 1-DQ[1] | 0-CA[1] |
| K 541 | 1-CA[0] | 1-DQ[3] |
| L 542 | 1-DQ[0] | 1-DQ[1] |

In at least one embodiment, the DDR signal logic 520 routes or communicates signals to and from appropriate PHY based on whether LPDDR3 or LPDDR4 is used. For example, a control signal may be received that conveys one of two values. The DDR signal logic 520 is configured to determine which of the two values is conveyed. If it is determined the value is a first value the DDR signal logic 520 implements the table entries in Table 1 for the LPDDR4 configuration. Otherwise, if it is determined that the value is a second value, the DDR signal logic 520 implements the table entries in Table 1 for the LPDDR3 configuration.

Furthermore, the various PHYs of the common die 500 are configured based on whether LPDDR3 or LPDDR4 is used. Some of the PHYs are configured as the same type of PHY for each DDR version that is used. For example, according to Table 1, PHY A 531 is configured as a DQ PHY (albeit for different channels) regardless of which version of DDR version is used. Other PHYs are configured as different types of PHYs for each DDR version used. For example, according to Table 1, PHY K 541 is configured as a CA PHY if LPDDR4 memory is used and is configured as a DQ PHY if LPDDR3 memory is used.

The signals for DQ lines are indicated as bidirectional in FIG. 6. For a DQ PHY, data is provided from DDR signal logic 520 to memory controller 510 for a read operation, and data is provided from memory controller 510 to DDR signal logic 520 for a write operation. Although a DQ signal is indicated as bidirectional, in some embodiments, there are separate paths for write data and read data.

The signals for CA lines are indicated as unidirectional in FIG. 6. For a CA PHY, data is provided in only one direction—from memory controller 510 to DDR signal logic 520, and ultimately to DDR SDRAM. A CA signal for a channel provides control and/or address information for corresponding DQ bytes for that channel. Since the common die 500 is configurable based on the memory type (e.g., LPDDR3 or LPDDR4) being supported, the common die 500 may also be referred to as a configurable die.

Figure 7:
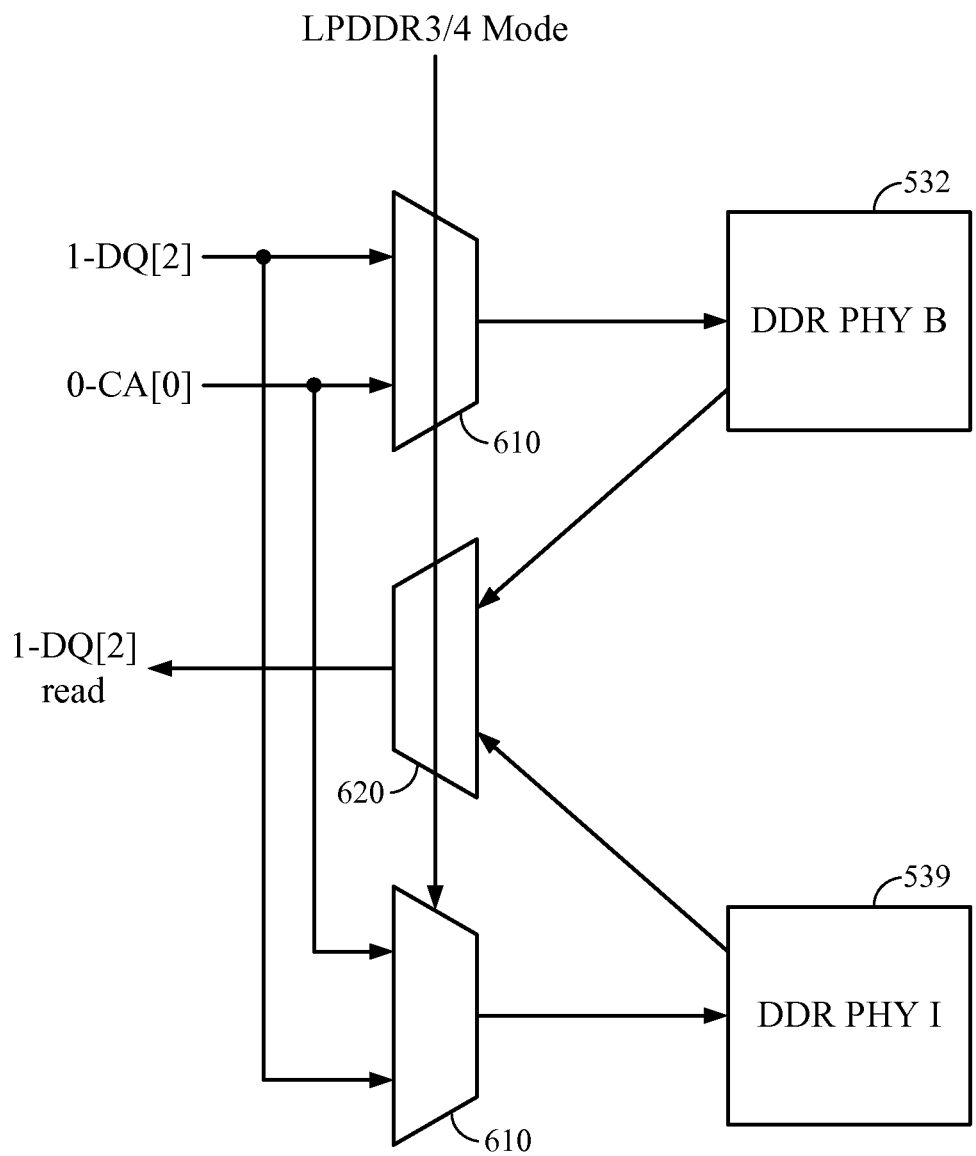
FIG. 7 illustrates a portion of DDR signal logic in accordance with an embodiment of the disclosure.

There are numerous ways to implement DDR signal logic 520 for implementing Table 1. In one embodiment for transmission to the DDR PHYs from the memory controller 510, twelve multiplexers (each may handle multiple bits) can be used that that select between one of two signals from the memory controller 510 depending on whether LPDDR3 or LPDDR4 is used. FIG. 7 illustrates two such multiplexers 610. For transmission to PHY B 532 on the common die, the multiplexer 610 has 0-CA[0] and 1-DQ[2] as inputs and selects 0-CA[0] if LPDDR4 is used and 1-DQ[2] if LPDDR3 is used according to a control signal (indicated in the figure as LPDDR3/4 mode). Also, PHY B 532 is preconfigured appropriately as a CA PHY or DQ PHY depending on the version of LPDDR used. Likewise, PHY I 539 is preconfigured appropriately depending on the version of LPDDR used.

Receiving signals at the memory controller from the DDR PHYs can be configured similarly—that is, using multiplexers with two inputs from the DDR PHYs and one output to the memory controller 510. Each DDR PHY has a return signal because each DDR PHY is generic. In some embodiments, only the return signals from PHYs configured as DQ PHYs are used. The multiplexer 620 has return signals from PHY B 532 and PHY I 539 as inputs, and selects the return signal corresponding to the PHY configured as a DQ PHY. In this example, the return signal is a 1-DQ[2] memory read signal.

Figure 8A:
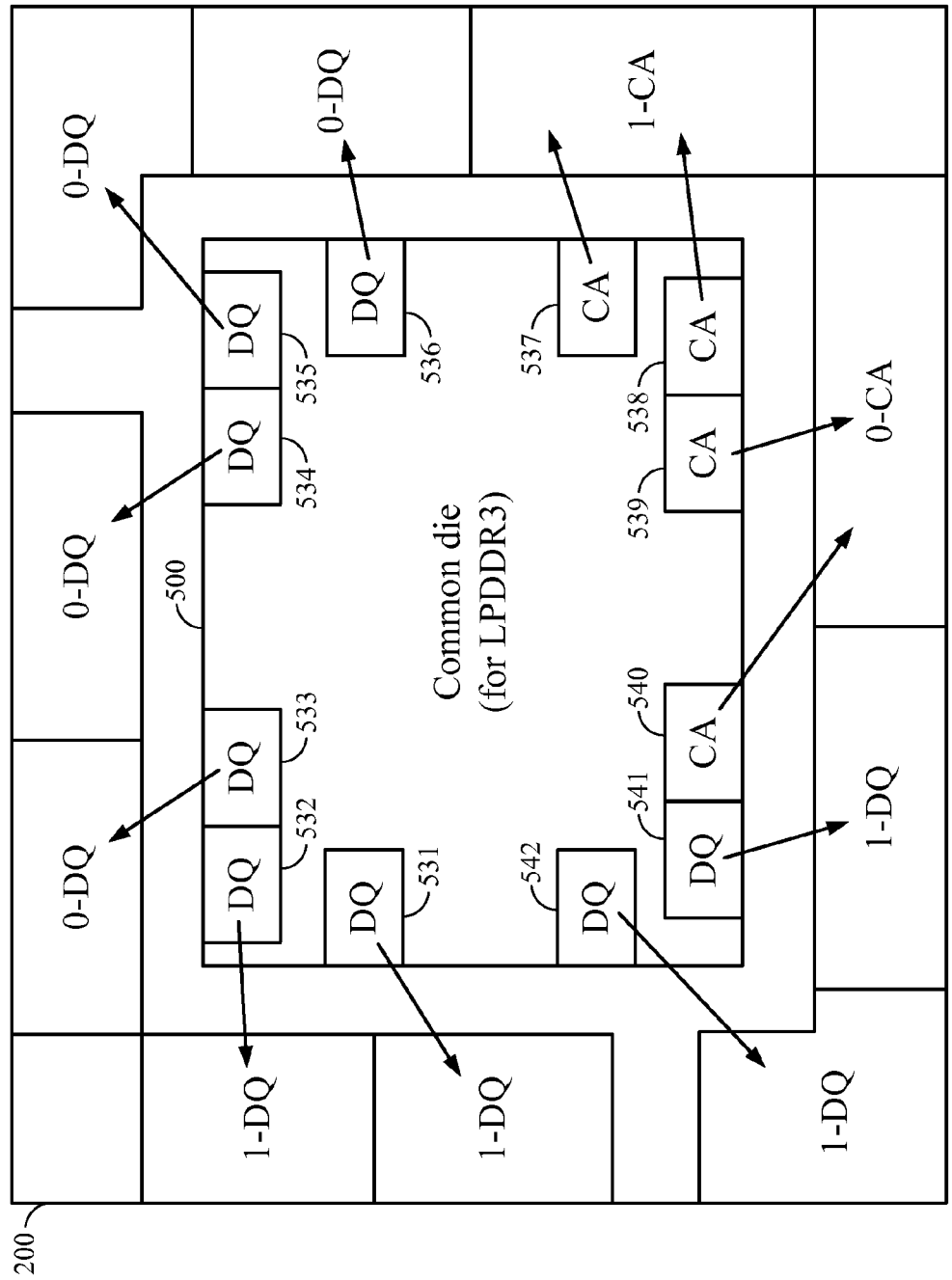
FIG. 8A illustrates connections between a common die configured for LPDDR3 PoP and an LPDDR3 footprint in accordance with an embodiment of the disclosure, and FIG.

FIG. 8A illustrates connections between the common die 500 configured for LPDDR3 PoP and the LPDDR3 footprint 200, previously illustrated in FIG. 2. The configurations of PHYs 531-542 are illustrated and follow Table 1. For ease of illustration, the byte numbers and channel numbers are dropped from the notation for the PHYs 531-542. Each of the arrows represents a logical connection between I/O pins of a PHY on the common die 500 and the corresponding package ball locations on the SoC package whose positions match the memory package (PoP) footprint. The common die 500 allows for simple PoP interconnections between the die 500 and LPDDR3 memory. For example, the connections illustrated by FIG. 8A are simpler than the connections illustrated by a die optimized for LPDDR4 in FIG. 4.

Figure 8B:
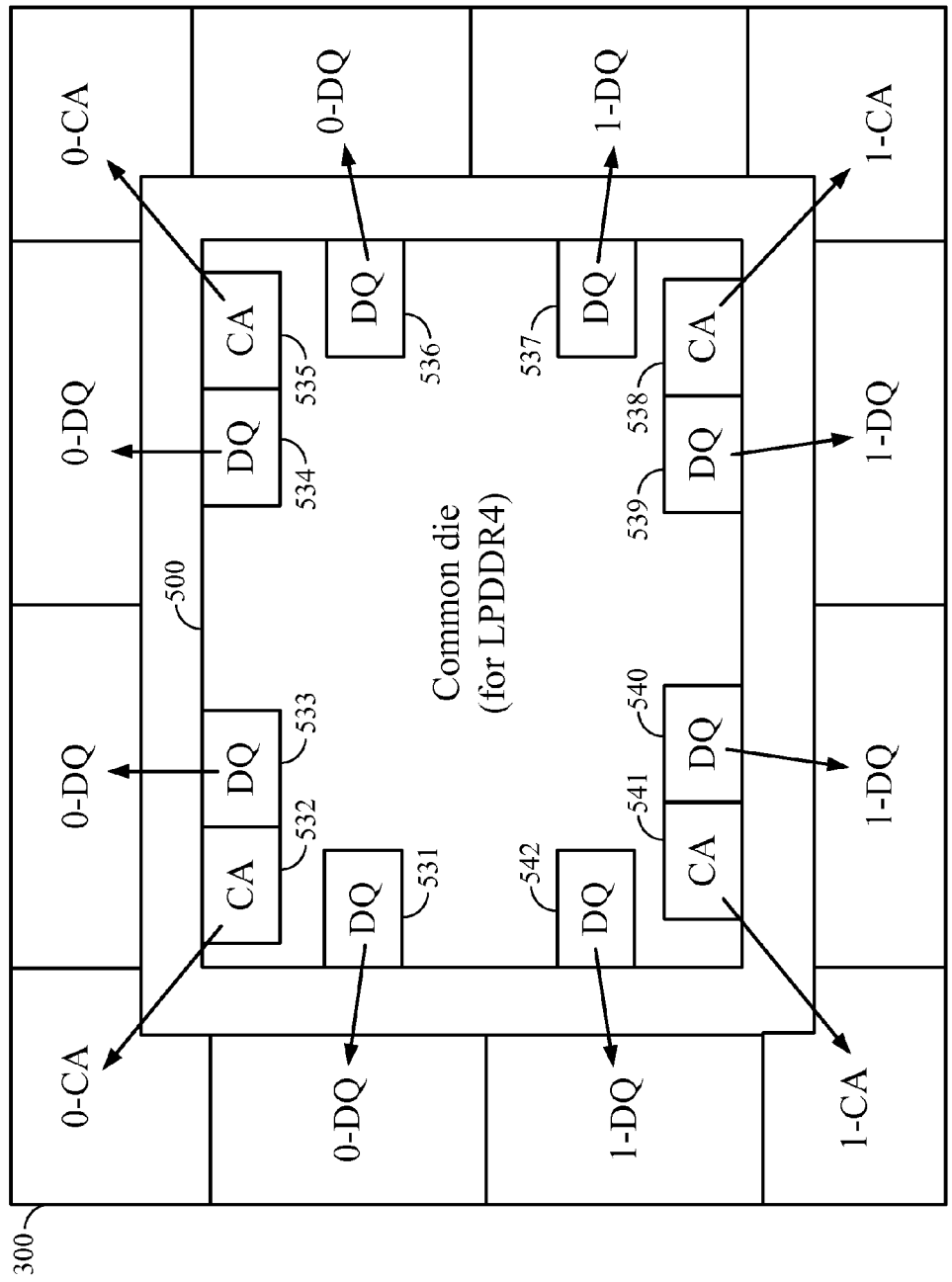

FIG. 8B illustrates connections between the common die 500 configured for LPDDR4 PoP and the LPDDR4 footprint 300, previously illustrated in FIG. 3. The configurations of PHYs 531-542 are illustrated and follow Table 1. As in FIG. 8A, for ease of illustration, the byte numbers and channel numbers are removed from the notation for the PHYs 531-542. The common die 500 results in simple connections for LPDDR4, as demonstrated in FIG. 8B. Thus, the common die 500 accommodates simple connections for both LPDDR3 and LPDDR4. The common die 500 eliminates any need for an interposer or other complex routing (such as additional layers in a base package) in a PoP for either LPDDR3 or LPDDR4.

The embodiments for common die 500 in FIGS. 8A and 8B applies to two specific orientations of memories with respect to the common die 500 for illustrative purposes, with a focus on certain orientations of LPDDR3 and LPDDR4 footprints 200 and 300, respectively. However, this disclosure applies generally to accommodate any two arbitrary memory PoP footprints using a single die. For example, this disclosure applies to the scenario in which one of the LPDDR3 or LPDDR4 footprints is rotated clockwise or counterclockwise in a plane by some amount, such as 90 degrees, 180 degrees, etc. with respect to a die. As one of ordinary skill in the art will recognize, different footprints can be accommodated by straightforward changes to Table 1, the DDR signal logic 520, and the configurable PHYs. Finally, the embodiments of common die 500 FIGS. 8A and 8B illustrate the PHYs being arranged in a rectangular manner for illustrative purposes. However, the disclosure applies regardless of the geometric arrangement of PHYs so long as the arrangement is consistent between LPDDR3 and LPDDR4. The flexible architectures and configurable PHYs presented herein can accommodate memories with different footprints while keeping complexity and packages costs low.

FIG. 9 is a perspective view of an embodiment of a PoP 700 using a common die. The PoP 700 includes a DDR memory package 710. The DDR memory package 710 includes a DDR memory die 705 connected to a DDR memory substrate 715. As shown in FIG. 9, the DDR memory package 710 is connected to the DDR memory substrate 715 via wire bonds. Wire bonds are used as an example connection for illustration, but there are other ways known in the art to connect the DDR memory package 710 to the DDR memory substrate 715.

The PoP 700 further includes a SoC package that includes a common die 725 connected to a base substrate 735. As shown in FIG. 9, the common die 725 is connected to the base substrate 735 via solder bumps. Solder bumps are used as an example connection for illustration, but there are other ways known in the art to connect the common die 725 to the base substrate 735.

The DDR memory package 710 is connected to the base substrate 735 using package balls 730. The use of common die 725 results in simple connections 730 between packages regardless of whether the DDR memory die 705 includes an LPDDR3 or LPDDR4 memory. For example, in some embodiments, no interposer is needed between DDR memory package 710 and the base substrate 735 for routing connections.

This disclosure applies generally not only to scenarios described previously in which DDR SDRAM is mounted on an SoC as a PoP configuration, but also in scenarios which the DDR SDRAM is placed on the SoC next to the memory area of a common die in a side-by-side configuration. When a memory is placed next to control circuitry traces may be used to connect DDR PHYs on the common die to the memory. The side-by-side configuration of the memory area of a die, such as memory circuitry 140, next to a memory having a footprint, such as footprints 200 or 300, can be accommodated by straightforward changes to Table 1, the DDR signal logic 520, and the configurable PHYs. A memory package placed next to memory circuitry 140 on a common die is an example of an external package.

In some embodiments, in order to provide accurate timing for all PHYs, regardless of whether configured as channel 0 or channel 1, a single clock controller (CC) is used that matches a clock to all channels and all PHYs. This stands in contrast to the situation in which a die is optimized for a particular memory type, in which case the die may include two CCs—one CC for channel 0 and another CC for signals for channel 1.

FIG. 10 illustrates a die 800 common to both LPDDR3 and LPDDR4 that includes a single CC 810. The common die 800 also includes a memory controller 510, DDR signal logic 520, and PHYs A-L 531-542 described previously. The connections or clock routes between CC 810 and PHYs 531-542 are illustrated as dashed lines 820. In an embodiment, the CC 810 provides a differential clock matched to all PHYs 531-542 regardless of the channel a given PHY represents. In an embodiment, the CC 810 provides different clock speeds depending on whether the memory type is LPDDR3 or LPDDR4. In one embodiment, the clock speed for LPDDR4 is 1333 MHz, and the clock speed for LPDDR3 is 933 MHz. As compared to some conventional embodiments, common die 800 eliminates one CC because some conventional embodiments employ two CCs, or one per channel. The saving of one CC in these embodiments comes at the expense of matching twice as many clock routes.

In an embodiment, the memory controller 510, DDR signal logic 520, and CC 810 are roughly in the middle of the memory portion of die 800 so that signal paths are approximately the same length to the various PHYs 531-542. Equidistant paths help ensure that signals take approximately the same amount of time to travel to and from PHYs 531-542, which in turn helps to ensure proper signal timing. In another embodiment, the signal paths to and from the various PHYs 531-542 are not approximately the same length, in which case delay buffers may be used to ensure proper signal timing.

A flow diagram of an example method 900 of using a common die, such as common die 500 illustrated in FIGS. 5, 8A, and 8B or common die 800 illustrated in FIG. 10, is shown in FIG. 11. In one example, method 900 is performed by a common die, such as die 500 of FIG. 5, to interface with a particular, selected memory type. The method 900 begins in block 910 in which a memory type indication is received. In an embodiment, the memory type indication is received by DDR signal logic 520 as well as PHYs A 531 through L 542. The memory type indication may also be received by CC 810 so that an appropriate clock speed can be selected. In an embodiment, the memory type indication indicates whether LPDDR3 or LPDDR4 is used, and the memory type indication may be stored in a register, such as a CSR, as small as one bit for this purpose. The DDR signal logic 520 employs the memory type indication to select routes for signals from the memory controller 510 to DDR SDRAM via PHYs A 531 through L 542 and for signals to the memory controller from DDR SDRAM via PHYs A 531 through L 542. In an embodiment, the DDR signal logic 520 is configured to use the memory indication to route CA and DQ signals according to Table 1.

Next in block 920, a CA signal and a DQ signal are received, for example, by DDR signal logic 520. In one embodiment, the DDR signal logic 520 receives the CA signal and the DQ signal from the memory controller 510. The CA signal and the DQ signal are not necessarily received at the same time and may be separated in time by some amount. For a write operation, for example, at least one CA signal is used to provide address information to indicate where to store data in the DQ signal. Although block 920 is directed to receiving one CA signal and one DQ signal, operating a memory in an ongoing basis will result in a plurality of CA signals being received from the memory controller 510 and a plurality of DQ signals received from both the memory controller 510 (e.g., for write operations) and the DQ PHYs (e.g., for read operations). Also, since LPDDR3 and LPDDR4 utilize a plurality of DQ PHYs and a plurality of CA PHYs, corresponding signals for the DQ and CA PHYs are generated, which will result in a plurality of DQ signals and a plurality of CA signals. In an embodiment, an additional action is performed in which clock signals for each of the DQ and CA PHYs are generated by a single clock controller, such as CC 810 described earlier. In such an embodiment, the clock signals are matched to each PHY.

In block 930, the CA signal is communicated or routed, based on the memory type indication, to a generic PHY configured as a CA PHY. In an embodiment, the DDR signal logic 520 performs this action. For example, the routing may be performed according to a table, such as Table 1. For example, if LPDDR4 is being used, the memory type indication in block 910 indicates LPDDR4, and signal 0-CA[0] is routed to DDR PHY B 532, which is configured as a CA PHY. In some embodiments, prior to block 930, an additional action is included of configuring DDR PHY B 532 as a CA PHY based on the memory type indication.

Next in block 940, the DQ signal is communicated or routed, based on the memory type indication, to a generic PHY configured as a DQ PHY. In an embodiment, the DDR signal logic 520 performs this action. For example, the routing may be performed according to a table, such as Table 1. For example, if LPDDR4 is being used, the memory type indication in block 910 indicates LPDDR4, and signal 0-DQ[0] is communicated to DDR PHY A 531, which is configured as a DQ PHY. In some embodiments, prior to block 940, an additional action is included of configuring DDR PHY A 531 as a DQ PHY based on the memory type indication.

The method 900 may additionally include receiving a second DQ signal and communicating the DQ signal to a memory controller. The second DQ signal may be received from a generic PHY configured as a DQ PHY and communicated to a memory controller 510 using DDR signal logic 520. That is, the method 900 may include communicating or routing DQ signals both to and from the memory controller 510.

Although LPDDR3 and LPDDR4 have been used in various embodiments as examples of memory types, various embodiments of configurable dies presented herein can be modified using the principles of the disclosure to accommodate various other types of memory and their associated packages and interfaces with minimal cost and packaging complexity. For example, combinations of any current or future version of LPDDR can be supported. In an embodiment, a configurable die may support a first type of memory package configuration, such as a PoP, and a second type of memory package configuration, such as an external package, with minimal cost and packaging complexity. In an embodiment, a configurable die may be configurable to support a first type of memory and a second type of memory with minimal packaging complexity, wherein the second type of memory includes a different type of interface (e.g., quad or octal data rate) than the first type of memory.

The scope of embodiments is not limited to the specific method shown in FIG. 11. Other embodiments may add, omit, rearrange, or modify one or more actions. For instance, in many real-world applications, the actions of blocks are not performed in series. For example, if the CA signal and the DQ signal in block 920 are received at substantially the same time, the routing steps in blocks 930 and 940 may be performed at substantially the same time. Also, in some embodiments, block 910 is performed once to configure the DDR signal logic 520 and generic PHYs and then block 910 is not performed again for a given common die, such as common die 500. Thereafter, blocks 920-940 may be performed repeatedly during operation of the corresponding memory.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A configurable die comprising:
    a logic element configured to communicate a control and address (CA) signal and a data (DQ) signal; and
    a first generic physical interface (PHY) and a second generic PHY in communication with the logic element, wherein each of the first generic PHY and the second generic PHY is configurable either as a CA PHY or as a DQ PHY, and wherein the logic element is configurable to communicate the CA signal and the DQ signal to different ones of the first and second generic PHYs.

2. The configurable die of claim 1, wherein:
    the logic element is further configured to:
    receive a signal that conveys a value that is either a first value or a second value;
    if the value is the first value:
        communicate the CA signal to the first generic PHY, and
        communicate the DQ signal to the second generic PHY; and
    if the value is the second value:
        communicate the CA signal to the second generic PHY, and
        communicate the DQ signal to the first generic PHY.

3. The configurable die of claim 2, wherein the first value corresponds to a type of memory that is a low power double data rate synchronous dynamic random-access memory 3 (LPDDR3), and wherein the second value corresponds to a type of memory that is LPDDR4.

4. The configurable die of claim 1, further comprising:
    a first plurality of generic PHYs and a second plurality of generic PHYs configured as DQ PHYs, wherein the first plurality of PHYs is further configured to receive DQ signals according to a first channel, and wherein the second plurality of PHYs is further configured to receive DQ signals according to a second channel; and a clock controller (CC) configured to provide matching clock signals to each of the first plurality of PHYs and the second plurality of PHYs.

5. The configurable die of claim 1, wherein the configurable die further comprises a memory controller coupled to the logic element and configured to generate the CA signal and the DQ signal.

6. The configurable die of claim 5, further comprising a modem coupled to the memory controller.

7. The configurable die of claim 3, wherein the first generic PHY is configured as a DQ PHY to generate a second DQ signal to support an LPDDR4 type of memory.

8. The configurable die of claim 3, wherein the first generic PHY is configured as a DQ PHY to generate a second DQ signal to support an LPDDR4 type of memory.

9. An apparatus comprising:
a system on chip (SoC) for selectively supporting a first type of memory and a second type of memory, comprising:
a generic physical interface (PHY) that is configurable either as a control and address (CA) PHY or as a data (DQ) PHY in response to an input corresponding to which of the first type of memory or the second type of memory is being supported; and
means for communicating CA signals or DQ signals to the generic PHY in response to the input.

10. The apparatus of claim 9, wherein the SoC further comprises a memory controller configured to provide the CA signals and the DQ signals.

11. The apparatus of claim 9, wherein the SoC is configured to support the first type of memory, wherein the generic PHY is configured as a CA PHY, and wherein the means for communicating is configured to communicate only CA signals from the memory controller to the generic PHY based on the input.

12. The apparatus of claim 9, wherein the SoC is configured to support the second type of memory, wherein the generic PHY is configured as a DQ PHY, and wherein the means for communicating is configured to communicate only DQ signals from the memory controller to the generic PHY based on the input.

13. The apparatus of claim 9, further comprising:
a first package configured to house the means for communicating and the first PHY; and a second package comprising a memory and coupled to the first package in a package-on-package (PoP) configuration or in a side-by-side package configuration.

14. The apparatus of claim 9, wherein the means for communicating is configured to receive a CA signal and a DQ signal and select between the CA signal and the DQ signal to send to the generic PHY, and wherein the selection is based on a control signal input.

15. The apparatus of claim 9, wherein the first type of memory is a low power double data rate synchronous dynamic random-access memory 3 (LPDDR3), and wherein the second type of memory is a LPDDR4.

16. The apparatus of claim 15, further comprising:
a first plurality of generic PHYs and a second plurality of generic PHYs; and
a clock controller (CC) configured to provide matching clock signals to each of the first plurality of PHYs and the second plurality of PHYs,
wherein the SoC is configured to support LPDDR4, wherein the first plurality of generic PHYs and the second plurality of generic PHYs are configured as DQ PHYs, wherein the first plurality of PHYs is further configured to receive DQ signals according to a first channel for LPDDR4, and wherein the second plurality of PHYs is further configured to receive DQ signals according to a second channel for LPDDR4.

17. A package-on-package (PoP) apparatus comprising:
a first package comprising memory circuitry configured to selectively support one of a first type of memory and a second type of memory, wherein the memory circuitry comprises:
a plurality of physical interfaces (PHYs), wherein each of the plurality of interfaces is selectively configurable either as a control and address (CA) PHY or as a data (DQ) PHY; and
a logic element configured to:
communicate CA signals to PHYs in the plurality of PHYs configured as CA PHYs; and
communicate DQ signals to and from PHYs in the plurality of PHYs configured as DQ PHYs; and
a second package comprising the first type of memory or the second type of memory, wherein the second package is coupled to the first package in a PoP configuration.

18. The PoP apparatus of claim 17, wherein in a first configuration:
the first type of memory is low power double data rate synchronous dynamic random-access memory 3 (LPDDR3);
the second package comprises LPDDR3 memory; and
the plurality of PHYs is configured in a first arrangement of CA and DQ PHYs compatible with LPDDR3.

19. The PoP apparatus of claim 18, wherein in a second configuration:
the second type of memory is LPDDR4;
the second package comprises LPDDR4 memory; and
the plurality of interfaces is configured in a second arrangement of CA and DQ PHYs compatible with LPDDR4.

20. The PoP apparatus of claim 18, wherein the DQ signals and the CA signals comprise signals for a first LPDDR3 channel and signals for a second LPDDR3 channel, wherein the PoP apparatus further comprises a clock controller (CC) configured to provide matching clock signals to each PHY and for each channel.

21. The PoP apparatus of claim 17, further comprising a memory controller coupled to the memory circuitry and configured to generate the CA signals and the DQ signals.

22. The PoP apparatus of claim 21, further comprising a modem coupled to the memory controller.

23. The PoP apparatus of claim 21, wherein the logic element comprises a plurality of multiplexers, each of which selects between at least two signals generated by the memory controller to select one of the signals for a corresponding PHY, and wherein the selection corresponds to the type of memory supported.

24. The PoP apparatus of claim 19, wherein second package is coupled to the first package without the use of an interposer.

25. A method for supporting different memory types using a single die, the method comprising:
communicating with a first generic physical interface (PHY) and a second generic PHY, each of the first generic PHY and the second generic PHY being configurable either as a CA PHY or as a DQ PHY;
receiving a memory type indication;
communicating, based on the memory type indication, a control and address (CA) signal to the first generic PHY when the first generic PHY is configured as a CA PHY; and communicating, based on the memory type indication, a data (DQ) signal to the second generic PHY when the second generic PHY is configured as a DQ PHY.

26. The method of claim 25, further comprising:
configuring the first generic PHY as a CA PHY based on the memory type indication; and
configuring the second generic PHY as a DQ PHY based on the memory type indication.

27. The method of claim 25, wherein the memory type indication indicates low power double data rate synchronous dynamic random-access memory 3 (LPDDR3) or LPDDR4.

28. The method of claim 25, further comprising communicating a second DQ signal from the second generic PHY to a memory controller based on the memory type indication.

29. The method of claim 27, further comprising generating matching clock signals for clocking the first generic PHY and the second generic PHY, wherein the CA signal and the DQ signal correspond to different channels for an LPDDR4 memory.

* * * * *